United States Patent
Ismail et al.

(10) Patent No.: US 11,611,338 B2
(45) Date of Patent: Mar. 21, 2023

(54) TRANSISTOR AGING REVERSAL USING HOT CARRIER INJECTION

(71) Applicant: Apple Inc., Cupertino, CA (US)

(72) Inventors: Aly Ismail, San Diego, CA (US); Amr Haggag, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/399,760

(22) Filed: Aug. 11, 2021

(65) Prior Publication Data
US 2022/0103169 A1 Mar. 31, 2022

Related U.S. Application Data

(60) Provisional application No. 63/083,514, filed on Sep. 25, 2020.

(51) Int. Cl.
*H03K 17/30* (2006.01)

(52) U.S. Cl.
CPC ... *H03K 17/302* (2013.01); *H03K 2217/0054* (2013.01); *H03K 2217/9401* (2013.01)

(58) Field of Classification Search
CPC ......... H03K 17/302; H03K 2217/0027; H03K 2217/0054; H03K 2217/9401; H03K 17/145
See application file for complete search history.

(56) References Cited

U.S. PATENT DOCUMENTS

| | | | |
|---|---|---|---|
| 7,212,023 B2 | 5/2007 | Krishnan et al. | |
| 7,511,540 B2 * | 3/2009 | Dickman | H02M 1/08 |
| | | | 327/108 |
| 7,605,543 B2 | 10/2009 | Lee et al. | |
| 7,952,378 B2 | 5/2011 | Marshall et al. | |
| 7,973,567 B2 * | 7/2011 | Vorenkamp | G06F 1/266 |
| | | | 327/51 |
| 7,994,827 B2 * | 8/2011 | Williams | H03K 17/6872 |
| | | | 327/377 |
| 8,912,990 B2 * | 12/2014 | Vieri | G09G 3/3648 |
| | | | 345/87 |
| 9,419,565 B2 * | 8/2016 | Nobbe | H04B 17/12 |
| 2012/0194153 A1 * | 8/2012 | Cozzolino | H03K 17/063 |
| | | | 323/282 |
| 2022/0038092 A1 * | 2/2022 | Genc | H03K 17/162 |

* cited by examiner

*Primary Examiner* — Ryan Johnson
*Assistant Examiner* — Colleen J O Toole
(74) *Attorney, Agent, or Firm* — Fenwick & West LLP

(57) ABSTRACT

Embodiments relate to circuit for reversing a threshold voltage shift of a transistor. The circuit includes a current mirror for sensing a transistor current and generating a mirrored current corresponding to the sensed transistor current, a gate biasing module for providing a gate bias to the transistor, and a calibration engine configured to receive the mirrored current from the current mirror and to control the gate biasing module in response to determining whether the mirrored current is outside of a predetermined range indicative of a shift in the threshold voltage of the transistor. The gate biasing module includes a gate biasing circuit configured to operate the transistor in a region where hot carrier injection (HCI) is present, and a gate switch for coupling the gate biasing circuit to a gate terminal of the transistor.

17 Claims, 8 Drawing Sheets

TRANSISTOR AGING REVERSAL USING HOT CARRIER INJECTION

CROSS-REFERENCE TO RELATED APPLICATION

This application claims the benefit of and claims priority to U.S. Provisional Patent Application Serial No. 63/083,514, filed on Sep. 25, 2020, which is incorporated by reference herein in its entirety.

BACKGROUND

1. Field of the Disclosure

The present disclosure relates to an electronic circuit for reversing a shift in the threshold voltage of a transistor.

2. Description of the Related Art

As transistors operate in circuits such as amplifiers, transmitters, or receivers, certain parameters of the transistors may slowly change. This is sometimes referred to as transistor aging. For example, as transistors age, their threshold voltage may start shifting due to the trapping of electrons or holes in the gate oxide of the transistor. This trapping of electrons or holes can be caused due to strong vertical electric fields that are experienced by electrons or holes traveling from the drain to the source of the transistor. As the transistor age, additional electrons or holes are trapped in the gate oxide of the transistor, further shifting the threshold voltage of the transistor.

This shift in the threshold voltage of a transistor can reduce the performance of the transistor and the circuit that is implemented using the aging transistor. Moreover, because some aging is expected in transistors, circuit designers may design the circuits to only use a limited region of operations (e.g., a limited voltage swing) to prevent transistor aging from rendering the circuit inoperable.

SUMMARY

Embodiments relate to a circuit for reversing a threshold voltage shift of a transistor. The circuit includes a current mirror for sensing a transistor current and generating a mirrored current corresponding to the sensed transistor current, a gate biasing module for providing a gate bias to the transistor, and a calibration engine configured to receive the mirrored current from the current mirror and to control the gate biasing module in response to determining whether the mirrored current is outside of a predetermined range indicative of a shift in the threshold voltage of the transistor. The gate biasing module includes a gate biasing circuit configured to operate the transistor in a region where hot carrier injection (HCI) is present, and a gate switch for coupling the gate biasing circuit to a gate terminal of the transistor.

BRIEF DESCRIPTION OF THE DRAWINGS

Figure (FIG. 1 is a high-level diagram of an electronic device, according to one embodiment.

The figures depict, and the detailed description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments relate to an aging reversal circuit for reversing a threshold voltage shift of a transistor. Periodically, the aging reversal circuit tests the transistor to determine if the threshold voltage of the transistor has shifted more than a predetermined tolerance value, and operates the transistor in a stressed mode to inject charges (e.g., electrons or holes depending on the direction of the threshold voltage shift) into the gate oxide of the transistor to shift the threshold voltage back to a predetermined range.

Example Electronic Device

Embodiments of electronic devices, user interfaces for such devices, and associated processes for using such devices are described. In some embodiments, the device is a portable communications device, such as a mobile telephone, that also contains other functions, such as personal digital assistant (PDA) and/or music player functions. Exemplary embodiments of portable multifunction devices include, without limitation, the iPhone®, iPod Touch®, Apple Watch®, and iPad® devices from Apple Inc. of Cupertino, Calif. Other portable electronic devices, such as wearables, laptops or tablet computers, are optionally used. In some embodiments, the device is not a portable communications device, but is a desktop computer or other computing device that is not designed for portable use. In some embodiments, the disclosed electronic device may include a touch sensitive surface (e.g., a touch screen display and/or a touch pad). An example electronic device described below in conjunction with FIG. 1 (e.g., device 100) may include a touch-sensitive surface for receiving user input. The electronic device may also include one or more other physical user-interface devices, such as a physical keyboard, a mouse and/or a joystick.

Figure 1:
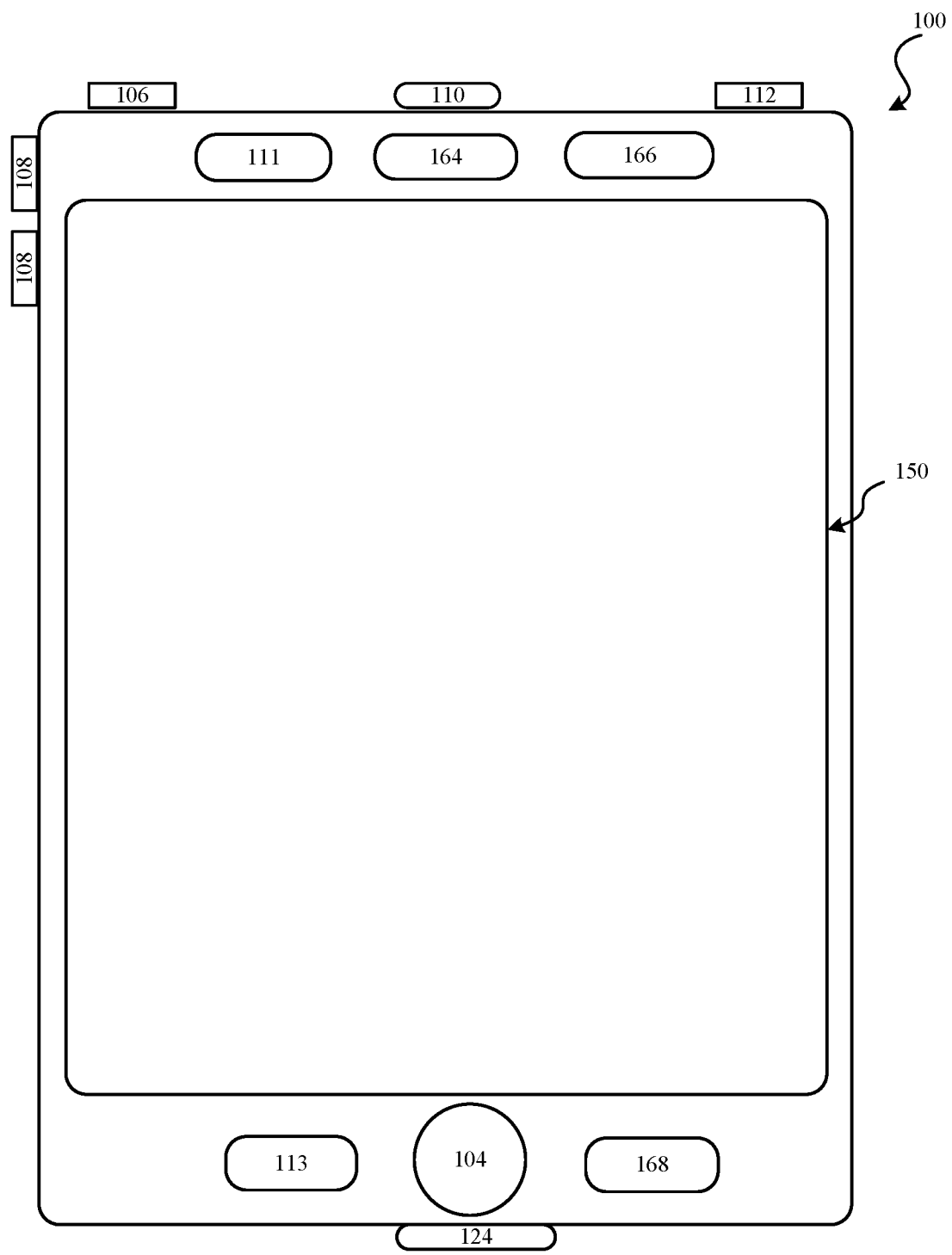

Figure (FIG. 1 is a high-level diagram of an electronic device 100, according to one embodiment. Device 100 may include one or more physical buttons, such as a "home" or menu button 104. Menu button 104 is, for example, used to navigate to any application in a set of applications that are executed on device 100. In some embodiments, menu button 104 includes a fingerprint sensor that identifies a fingerprint on menu button 104. The fingerprint sensor may be used to determine whether a finger on menu button 104 has a fingerprint that matches a fingerprint stored for unlocking device 100. Alternatively, in some embodiments, menu button 104 is implemented as a soft key in a graphical user interface (GUI) displayed on a touch screen.

In some embodiments, device 100 includes touch screen 150, menu button 104, push button 106 for powering the device on/off and locking the device, volume adjustment buttons 108, Subscriber Identity Module (SIM) card slot 110, head set jack 112, and docking/charging external port 124. Push button 106 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. Device 100 includes various components including, but not limited to, a memory (which may include one or more computer readable storage mediums), a memory controller, one or more central processing units (CPUs), a peripherals interface, an RF circuitry, an audio circuitry, speaker 111, microphone 113, input/output (I/O) subsystem, and other input or control devices. Device 100 may include one or more image sensors 164, one or more proximity sensors 166, and one or more accelerometers 168. Device 100 may include more than one type of image sensors 164. Each type may include more than one image sensor 164. For example, one type of image sensors 164 may be cameras and another type of image sensors 164 may be infrared sensors that may be used for face recognition. In addition, or alternatively, image sensors 164 may be associated with different lens configuration. For example, device 100 may include rear image sensors, one with a wide-angle lens and another with as a telephoto lens. Device 100 may include components not shown in FIG. 1 such as an ambient light sensor, a dot projector and a flood illuminator.

Device 100 is only one example of an electronic device, and device 100 may have more or fewer components than listed above, some of which may be combined into a component or have a different configuration or arrangement. The various components of device 100 listed above are embodied in hardware, software, firmware or a combination thereof, including one or more signal processing and/or application specific integrated circuits (ASICs). While the components in FIG. 1 are shown as generally located on the same side as touch screen 150, one or more components may also be located on an opposite side of device 100. For example, front side of device 100 may include an infrared image sensor 164 for face recognition and another image sensor 164 as the front camera of device 100. The back side of device 100 may also include additional image sensors 164 as the rear cameras of device 100.

Figure 2:
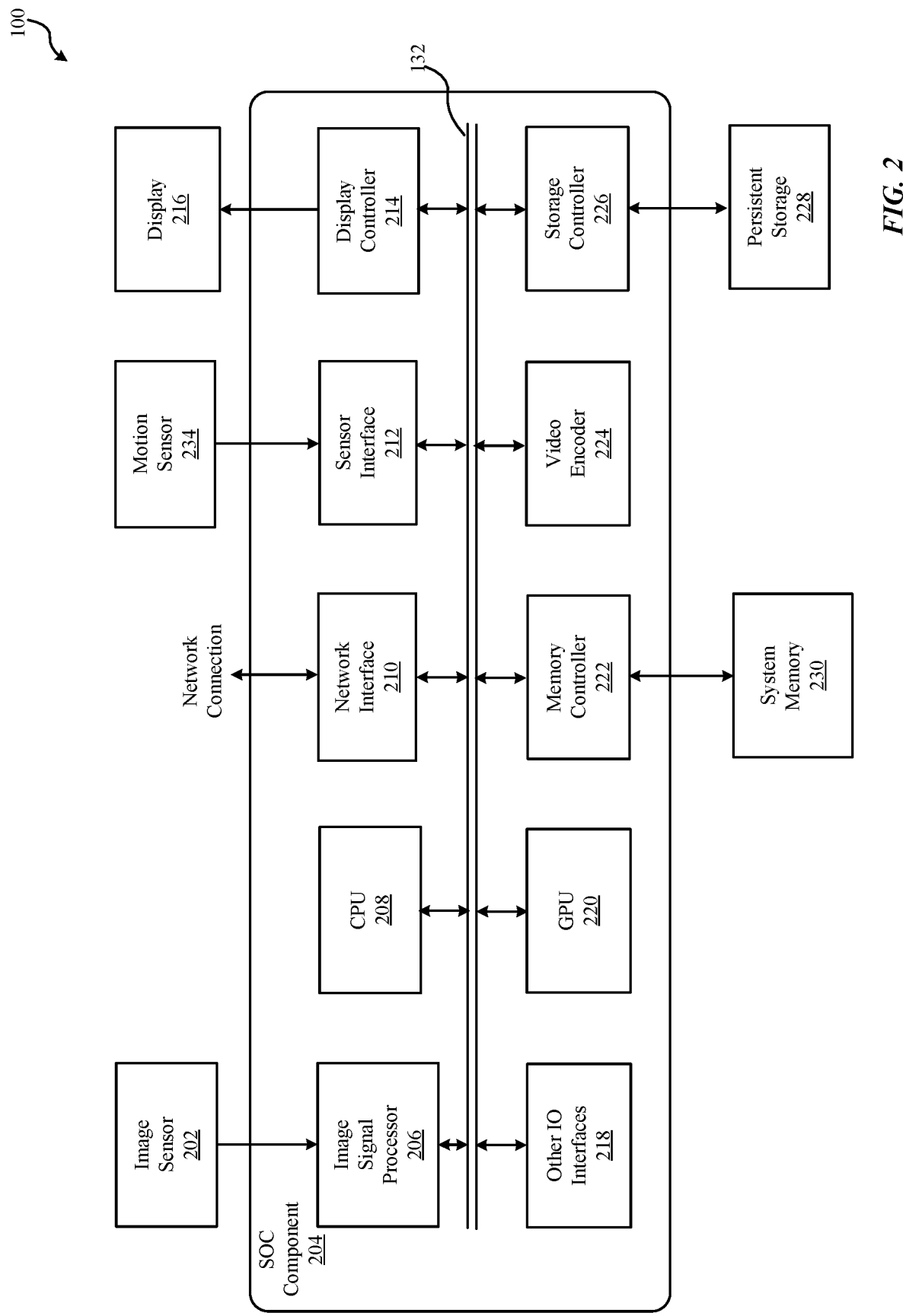
FIG. 2 is a block diagram illustrating components in the electronic device, according to one embodiment.

FIG. 2 is a block diagram illustrating components in device 100, according to one embodiment. Device 100 may perform various operations including implementing one or more machine learning models. For this and other purposes, device 100 may include, among other components, image sensors 202, a system-on-a chip (SOC) component 204, a system memory 230, a persistent storage (e.g., flash memory) 228, a motion sensor 234, and a display 216. The components as illustrated in FIG. 2 are merely illustrative. For example, device 100 may include other components (such as speaker or microphone) that are not illustrated in FIG. 2. Further, some components (such as motion sensor 234) may be omitted from device 100.

Image sensors 202 are components for capturing image data and may be embodied, for example, as a complementary metal-oxide-semiconductor (CMOS) active-pixel sensor, a camera, video camera, or other devices. Image sensors 202 generate raw image data that is sent to SOC component 204 for further processing. In some embodiments, the image data processed by SOC component 204 is displayed on display 216, stored in system memory 230, persistent storage 228 or sent to a remote computing device via network connection. The raw image data generated by image sensors 202 may be in a Bayer color kernel array (CFA) pattern.

Motion sensor 234 is a component or a set of components for sensing motion of device 100. Motion sensor 234 may generate sensor signals indicative of orientation and/or acceleration of device 100. The sensor signals are sent to SOC component 204 for various operations such as turning on device 100 or rotating images displayed on display 216.

Display 216 is a component for displaying images as generated by SOC component 204. Display 216 may include, for example, liquid crystal display (LCD) device or an organic light-emitting diode (OLED) device. Based on data received from SOC component 204, display 116 may display various images, such as menus, selected operating parameters, images captured by image sensors 202 and processed by SOC component 204, and/or other information received from a user interface of device 100 (not shown).

System memory 230 is a component for storing instructions for execution by SOC component 204 and for storing data processed by SOC component 204. System memory 230 may be embodied as any type of memory including, for example, dynamic random access memory (DRAM), synchronous DRAM (SDRAM), double data rate (DDR, DDR2, DDR3, etc.) RAMBUS DRAM (RDRAM), static RAM (SRAM) or a combination thereof.

Persistent storage 228 is a component for storing data in a non-volatile manner. Persistent storage 228 retains data even when power is not available. Persistent storage 228 may be embodied as read-only memory (ROM), flash memory or other non-volatile random access memory devices. Persistent storage 228 stores an operating system of device 100 and various software applications. Persistent storage 228 may also store one or more machine learning models, such as regression models, random forest models, support vector machines (SVMs) such as kernel SVMs, and artificial neural networks (ANNs) such as convolutional network networks (CNNs), recurrent network networks (RNNs), autoencoders, and long short term memory (LSTM). A machine learning model may be an independent model that works with the neural processor circuit 218 and various software applications or sensors of device 100. A machine learning model may also be part of a software application. The machine learning models may perform various tasks such as facial recognition, image classification, object, concept, and information classification, speech recognition, machine translation, voice recognition, voice command recognition, text recognition, text and context analysis, other natural language processing, predictions, and recommendations.

Various machine learning models stored in device 100 may be fully trained, untrained, or partially trained to allow device 100 to reinforce or continue to train the machine learning models as device 100 is used. Operations of the machine learning models include various computation used in training the models and determining results in runtime using the models. For example, in one case, device 100 captures facial images of the user and uses the images to continue to improve a machine learning model that is used to lock or unlock the device 100.

SOC component 204 is embodied as one or more integrated circuit (IC) chip and performs various data processing processes. SOC component 204 may include, among other subcomponents, image signal processor (ISP) 206, a central processor unit (CPU) 208, a network interface 210, sensor interface 212, display controller 214, neural processor circuit 218, graphics processor (GPU) 220, memory controller 222, video encoder 224, storage controller 226, and bus 232 connecting these subcomponents. SOC component 204 may include more or fewer subcomponents than those shown in FIG. 2.

ISP 206 is a circuit that performs various stages of an image processing pipeline. In some embodiments, ISP 206 may receive raw image data from image sensors 202, and process the raw image data into a form that is usable by other subcomponents of SOC component 204 or components of device 100. ISP 206 may perform various image-manipulation operations such as image translation operations, horizontal and vertical scaling, color space conversion and/or image stabilization transformations.

CPU 208 may be embodied using any suitable instruction set architecture, and may be configured to execute instructions defined in that instruction set architecture. CPU 208 may be general-purpose or embedded processors using any of a variety of instruction set architectures (ISAs), such as the x86, PowerPC, SPARC, RISC, ARM or MIPS ISAs, or any other suitable ISA. Although a single CPU is illustrated in FIG. 2, SOC component 204 may include multiple CPUs. In multiprocessor systems, each of the CPUs may commonly, but not necessarily, implement the same ISA.

Graphics processing unit (GPU) 220 is graphics processing circuitry for performing graphical data. For example, GPU 220 may render objects to be displayed into a frame buffer (e.g., one that includes pixel data for an entire frame). GPU 220 may include one or more graphics processors that may execute graphics software to perform a part or all of the graphics operation, or hardware acceleration of certain graphics operations.

Neural processor circuit 218 is a circuit that performs various machine learning operations based on computation including multiplication, addition, and accumulation. Such computation may be arranged to perform, for example, various types of tensor multiplications such as tensor product and convolution of input data and kernel data. Neural processor circuit 218 is a configurable circuit that performs these operations in a fast and power-efficient manner while relieving CPU 208 of resource-intensive operations associated with neural network operations. Neural processor circuit 218 may receive the input data from sensor interface 212, the image signal processor 206, persistent storage 228, system memory 230 or other sources such as network interface 210 or GPU 220. The output of neural processor circuit 218 may be provided to various components of device 100 such as image signal processor 206, system memory 230 or CPU 208 for various operations. The structure and operation of neural processor circuit 218 are described below in detail with reference to FIG. 3.

Network interface 210 is a subcomponent that enables data to be exchanged between devices 100 and other devices via one or more networks (e.g., carrier or agent devices). For example, video or other image data may be received from other devices via network interface 210 and be stored in system memory 230 for subsequent processing (e.g., via a back-end interface to image signal processor 206) and display. The networks may include, but are not limited to, Local Area Networks (LANs) (e.g., an Ethernet or corporate network) and Wide Area Networks (WANs). The image data received via network interface 210 may undergo image processing processes by ISP 206.

Sensor interface 212 is circuitry for interfacing with motion sensor 234. Sensor interface 212 receives sensor information from motion sensor 234 and processes the sensor information to determine the orientation or movement of device 100.

Display controller 214 is circuitry for sending image data to be displayed on display 216. Display controller 214 receives the image data from ISP 206, CPU 208, graphic processor or system memory 230 and processes the image data into a format suitable for display on display 216.

Memory controller 222 is circuitry for communicating with system memory 230. Memory controller 222 may read data from system memory 230 for processing by ISP 206, CPU 208, GPU 220 or other subcomponents of SOC component 204. Memory controller 222 may also write data to system memory 230 received from various subcomponents of SOC component 204.

Video encoder 224 is hardware, software, firmware or a combination thereof for encoding video data into a format suitable for storing in persistent storage 128 or for passing the data to network interface w10 for transmission over a network to another device.

In some embodiments, one or more subcomponents of SOC component 204 or some functionality of these subcomponents may be performed by software components executed on neural processor circuit 218, ISP 206, CPU 208 or GPU 220. Such software components may be stored in system memory 230, persistent storage 228 or another device communicating with device 100 via network interface 210.

Image data or video data may flow through various data paths within SOC component 204. In one example, raw image data may be generated from image sensors 202 and processed by ISP 206, and then sent to system memory 230 via bus 232 and memory controller 222. After the image data is stored in system memory 230, it may be accessed by video encoder 224 for encoding or by display 216 for displaying via bus 232.

In another example, image data is received from sources other than image sensors 202. For example, video data may be streamed, downloaded, or otherwise communicated to the SOC component 204 via wired or wireless network. The image data may be received via network interface 210 and written to system memory 230 via memory controller 222. The image data may then be obtained by ISP 206 from system memory 230 and processed through one or more image processing pipeline stages. The image data may then be returned to system memory 230 or be sent to video encoder 224, display controller 214 (for display on display 216), or storage controller 226 for storage at persistent storage 228.

Transistor Aging Reversal

One way to reverse the shift in threshold voltage due to trapped charges (e.g., electrons or holes) in the gate oxide of a transistor is to force the transistor to trap charges of opposite charge. That is, if a transistor experiences a threshold voltage shift due to the trapping of electrons (negative charges), the shift in threshold voltage due to the presence of electrons in the gate oxide of the transistor can be mitigated or reversed by trapping holes (positive charges) in the gate oxide of the transistor. Similarly, if a transistor experiences a threshold voltage shift due to the trapping of holes (positive charges), the shift in threshold voltage due to the presence of holes in the gate oxide of the transistor can be mitigated or reversed by trapping electrons (negative charges) in the gate oxide of the transistor.

Figure 3A:
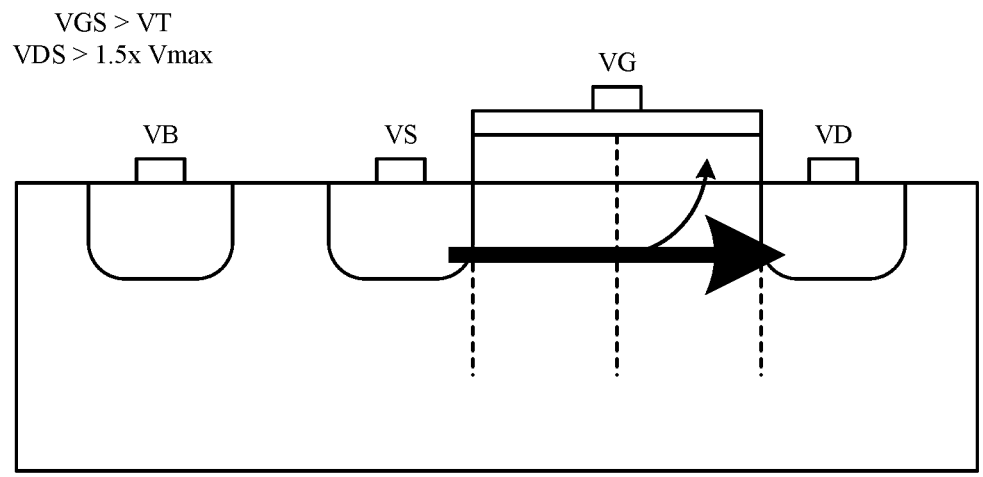
FIG. 3A illustrates a cross section of a transistor biased in a region where on-state hot carrier injection (HCI) is present.

FIG. 3A illustrates a cross section of a transistor biased in a region where on-state HCI is present. In FIG. 3A, the transistor is biased such that the gate-to-source voltage (VGS) is above the threshold voltage (VT) of the transistor, and the drain-to-source voltage of the transistor is above Vmax. As used herein, Vmax is the highest operating voltage for the transistor. In this region of operation, the transistor is turned on (i.e., a channel is formed between the source and the drain of the transistor, and minority carriers (i.e., electrons in an n-type transistor or holes in a p-type transistor) are able to flow through the channel. As the minority carriers travel through the channel, the minority carriers gain momentum. If a minority carrier gains sufficient energy to overcome a potential barrier, the electric field produced between the gate electrode and the channel of the transistor may attract the minority carrier towards the gate electrode of the transistor, causing the minority carrier to be injected into the gate oxide of the transistor. This process will produce minority carriers trapped in the gate oxide of the transistor, shifting the threshold voltage of the transistor accordingly.

Figure 3B:
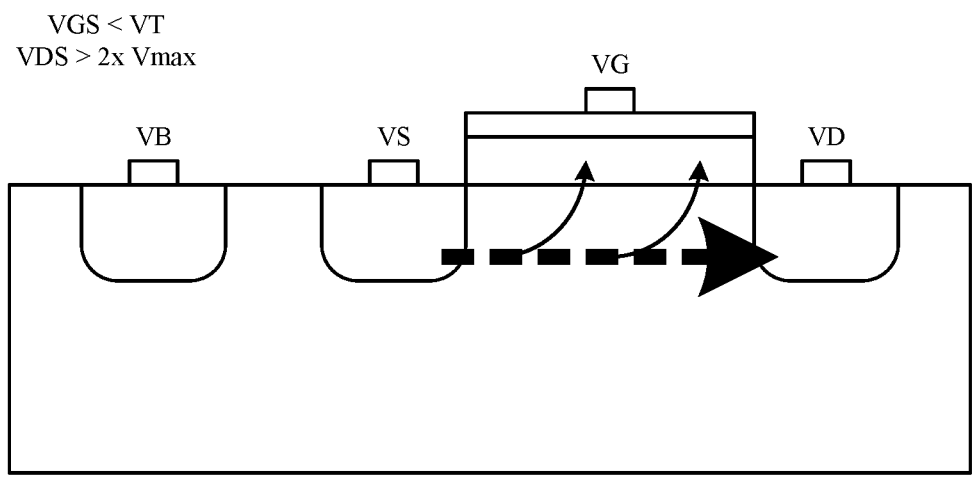
FIG. 3B illustrates a cross section of a transistor biased in a region where off-state HCI is present.

FIG. 3B illustrates a cross section of a transistor biased in a region where off-state HCI is present. In FIG. 3B, the transistor is biased such that the gate-to-source voltage (VGS) is below the threshold voltage (VT). As such, the transistor is turned off. However, if a large potential is applied between the drain and the source of the transistor, the produced electric field may allow majority carriers (i.e., holes in an n-type transistor or electrons in a p-type transistor) to flow through the body of the transistor.

If the majority carriers traveling through the body of the transistor gain enough energy to overcome the potential barrier, some of those majority carriers might be attracted towards the gate of the transistor, causing them to be injected into the gate oxide of the transistor. This process will produce majority carriers trapped in the gate oxide of the transistor, shifting the threshold voltage of the transistor accordingly. For example, since the polarity of the charges being trapped due to off-state HCI is opposite to the polarity of the charges being trapped due to on-state HCI, the charges trapped in a transistor due to off-state HCI shifts the threshold voltage of the transistor in an opposite direction than the charges trapped in the transistor due to on-state HCI.

Figure 4A:
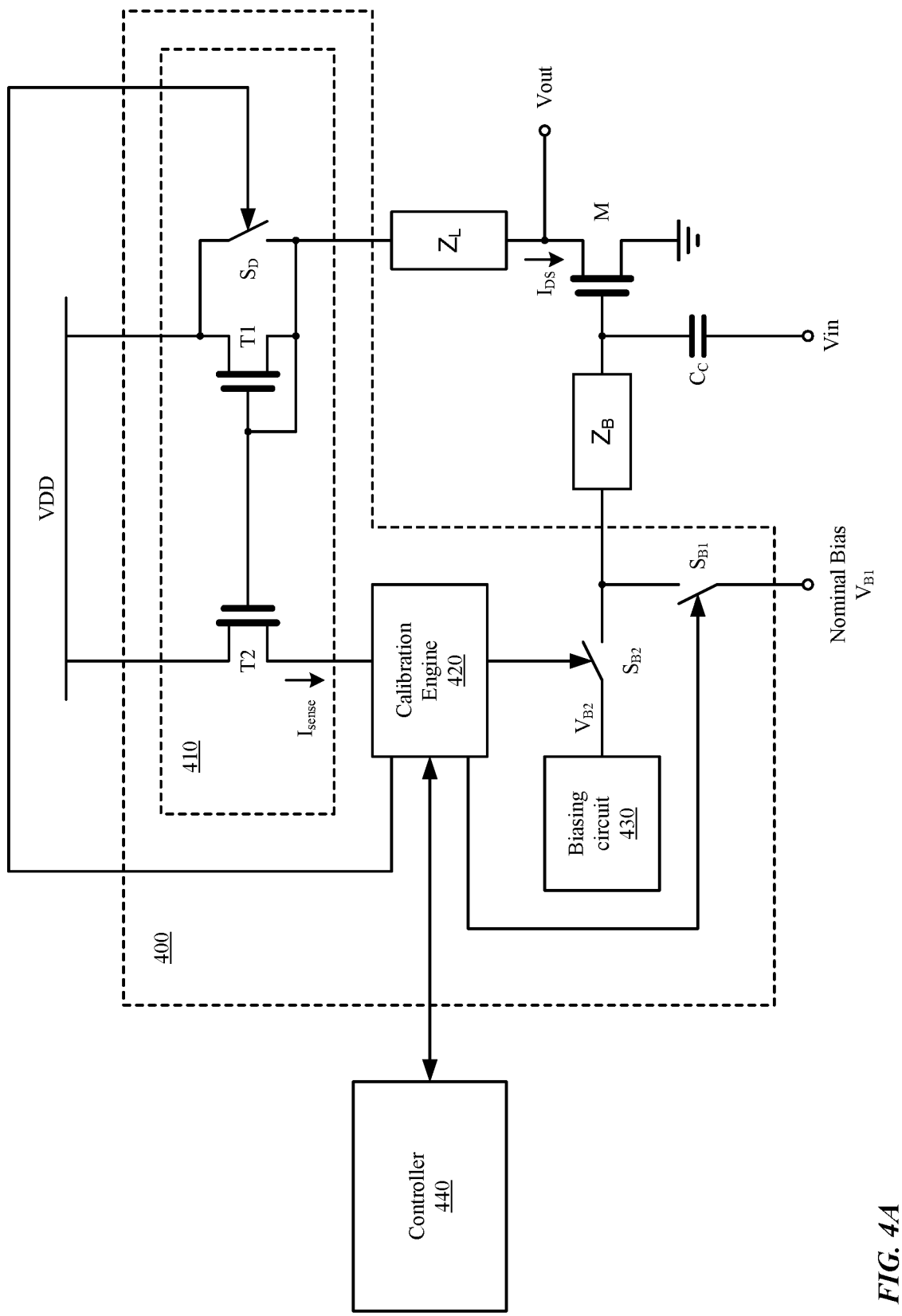
FIG. 4A illustrates a circuit diagram of an aging reversal circuit for restoring a threshold voltage of a transistor, according to one embodiment.

FIG. 4A illustrates a circuit diagram of an aging reversal circuit 400 for restoring a threshold voltage of a transistor M, according to one embodiment. The aging reversal circuit 400 may include, among other components, a current mirror 410, a calibration engine 420, and a biasing circuit 430. The aging reversal circuit 400 may be controlled by a controller 440. Moreover, the aging reversal circuit 400 may include multiple switches $S_{B1}$, $S_{B2}$, $S_D$. In other embodiments, the switches may be included inside other components, such as the biasing circuit 430 or the calibration engine 420. Moreover, although the circuit of FIG. 4A is illustrated using an n-type transistor, other implementations, such as one using a p-type transistor are also possible.

The current mirror 410 is coupled to the transistor M and is used for sensing a current $I_{DS}$ flowing through the transistor M. The current mirror 410 generates a mirrored current $I_{sense}$ that is indicative of an amount of current $I_{DS}$ flowing through the transistor M. In some embodiments, the current mirror 410 includes a switch $S_D$ for enabling or disabling the current mirror 410. When the switch $S_D$ is closed, the current mirror 410 is bypassed and thus disabled. However, when switch $S_D$ is opened, the current $I_{DS}$ flowing through the transistor is routed through the current mirror 410 to allow the sensing of the transistor current $I_{DS}$.

The current mirror 410 additionally includes a main transistor T1 and a mirror transistor T2. In some embodiments, main transistor T1 and mirror transistor T2 are connected to a power supply voltage VDD. The main transistor T1 is coupled to the transistor M and the mirror transistor T2 generates a mirrored current $I_{sense}$ that is proportional to the current $I_{DS}$ flowing through the main transistor T1. In some embodiments, the main transistor T1 is diode connected. Moreover, the switch $S_D$ is connected between the drain and the source of the main transistor T1. As such, when the switch $S_D$ is closed, the terminals of the main transistor T1 are shorted out, completely bypassing the main transistor T1.

The calibration engine 420 receives the mirrored current $I_{sense}$ and determines whether to adjust the threshold voltage of the transistor M. Since the current $I_{DS}$ flowing through a transistor is correlated with the threshold voltage $V_T$ of the transistor, by analyzing the current $I_{DS}$ flowing through the transistor M, the calibration engine 420 is able to determine if the threshold voltage of the transistor has shifter. In particular, if the measurement of the transistor's current $I_{DS}$ is performed while the transistor M operates in the saturation region, the current $I_{DS}$ flowing through the transistor M can be determined as follows:

$$I_{DS} = \frac{1}{2}\mu C_{ox}\frac{W}{L}(V_{GS} - V_T)^2(1 + \lambda V_{DS}) \qquad (1)$$

where $\mu$ is the minority carrier mobility, $C_{ox}$ is the oxide capacitance, W is the width of the transistor M, L is the length of the transistor M, and $\lambda$ is the channel length modulation parameter for the transistor M. Thus, as the threshold voltage $V_T$ of the transistor M increases (e.g., due to trapped charges in the oxide of the transistor M), the current $I_{DS}$ flowing through the transistor M decreases for a given gate-to-source voltage $V_{GS}$ and a given drain-to-source voltage $V_{DS}$. Moreover, as the threshold voltage $V_T$ of the transistor M decreases (e.g., due to trapped charges in the oxide of the transistor), the current $I_{DS}$ flowing through the transistor M increases for a given gate-to-source voltage $V_{GS}$ and a given drain-to-source voltage $V_{DS}$.

To determine whether a change in the current $I_{DS}$ that flows through transistor M has shifted from an initial value, the calibration engine 420 analyzes the magnitude of the mirrored current $I_{sense}$. That is, since the mirrored current $I_{sense}$ is derived from the transistor current $I_{DS}$, if the transistor current $I_{DS}$ changes, the mirrored current would also change in a similar fashion. In some embodiments, to analyze the mirrored current $I_{sense}$, the calibration engine 420 includes a current detector (not shown). The current detector portion of the calibration engine 420 detects a change in the mirrored current $I_{sense}$ from a baseline or reference value.

In some embodiments, the calibration engine 420 compares the mirrored current $I_{sense}$ to one or more reference currents and determines whether the mirrored current $I_{sense}$ is outside of a predetermined range. If the mirrored current $I_{sense}$ is outside of the predetermined range, the calibration engine 420 determines that the threshold voltage $V_T$ of the transistor M has shifted more than a predetermined amount. As such, if the mirrored current $I_{sense}$ is outside of the predetermined range, the calibration engine 420 initiates the process for adjusting the threshold voltage $V_T$ of the transistor M.

In other embodiments, the calibration engine 420 compares the mirrored current $I_{sense}$ to a reference current, and determines a difference between the mirrored current $I_{sense}$ and the reference current. If the mirrored current $I_{sense}$ is greater than the reference current by a predetermined amount, or smaller than the reference current by a predetermined amount, the calibration engine 420 initiates the process for adjusting the threshold voltage of the transistor M.

The calibration engine 420 may use one of many different methods for comparing the mirrored current $I_{sense}$ to either a current range or a reference current. For instance, the calibration engine 420 may compare a voltage drop across a known component (e.g., a resistor) due to the mirrored current $I_{sense}$ to a reference voltage. Alternatively, the calibration engine 420 may convert mirrored current $I_{sense}$ or the voltage drop across a known component due to the mirrored current $I_{sense}$ to a digital value. The calibration engine 420 can then determine if the digital value is within a predetermined range. In yet another example, the calibration engine 420 may subtract the reference current from the mirrored current $I_{sense}$ and may determine if the resulting current is larger than a predetermined value. In yet other embodiments, after subtracting the reference current from the mirrored current, the calibration engine 420 converts the resulting current into a voltage (e.g., by using a resistor), and compares the resulting voltage to one or more reference voltages. For example, the calibration engine 420 include a first comparator that determines if the resulting voltage is below a first reference voltage. Additionally, the calibration engine 420 may include a second comparator that determines if the resulting voltage is above a second reference voltage. By comparing the resulting voltage to the first or second reference voltage, the calibration engine 420 is able to determine if the threshold voltage $V_T$ of the transistor M has shifted more than a threshold amount (i.e., increased more than a threshold amount from a nominal value, or increased more than a threshold amount from the nominal value).

If the calibration engine 420 determines that the threshold voltage $V_T$ of the transistor M has shifted more than a predetermined amount, the calibration engine 420 controls switch $S_{B2}$ to connect the biasing circuit 430 to the gate of transistor M. That is, the calibration engine 420 closes switch $S_{B2}$ to allow the biasing circuit 430 to control the gate voltage of transistor M to cause transistor M to operate in a region where hot carrier injection (HCI) is present. Moreover, the calibration engine 420 opens switch $S_{B1}$ to disconnect the gate of transistor M from the nominal bias $V_{B1}$.

In some embodiments, the calibration engine 420 additionally determines in which direction the threshold voltage $V_T$ of the transistor M has shifted. That is, the calibration engine 420 may determine whether the threshold voltage $V_T$ has increased or decreased. Based on the direction of the threshold voltage shift, the calibration engine 420 determines whether to apply on-state HCI or off-state HCI to the transistor M. For example, in an n-type transistor, if the calibration engine 420 determines that the threshold voltage $V_T$ of a transistor M has increased (e.g., by determining that the mirrored current $I_{sense}$ is below a predetermined amount), the calibration engine 420 determines to apply an off-state HCI to trap majority carriers (holes) in the gate oxide of the transistor M to reduce shift the threshold voltage $V_T$ down, back to a prespecified acceptable range. Alternatively, if the calibration engine 420 determines that the threshold voltage $V_T$ of the transistor M has decreased (e.g., by determining that the mirrored current $I_{sense}$ is above a predetermined amount), the calibration engine 420 determines to apply an on-state HCI to trap minority carriers (electrons) in the gate oxide of the transistor M to reduce shift the threshold voltage $V_T$ up, back to the prespecified acceptable range.

The biasing circuit 430 generates a voltage $V_{B2}$ to bias the transistor in a region of operation where HCI is experienced. For example, the biasing circuit 430 generates a voltage $V_{B2}$ to bias the transistor in an off-state HCI region of operation. To bias the transistor M in an off-state HCI region of operation, the biasing circuit 430 generates a negative voltage to apply a negative bias to the gate of the transistor M. In some embodiments, the biasing circuit 430 generates the negative voltage from a positive voltage (e.g., from VDD). In some embodiments, the negative voltage generated by the biasing circuit 430 is equal to −VDD or −Vmax.

In another embodiment, to bias the transistor M in an off-state HCI region of operation, the biasing circuit 430 outputs a bias voltage of 0V or GND. In this embodiment, an additional drain biasing circuit (not shown) is included that generates a positive voltage (e.g., 2VDD or 2Vmax) to bias the drain of the transistor M. In this embodiment, an additional switch is included to selectively couple the drain biasing circuit to the drain of the transistor M.

In another example, the biasing circuit 430 generates a voltage $V_{B2}$ to bias the transistor in an on-state HCI region of operation. In some embodiments, to bias the transistor in an on-state HCI region of operation, a drain biasing circuit is also used to increase the drain bias of transistor M above the nominal drain bias voltage. To bias the transistor in an on-state HCI region of operation, the biasing circuit 430 generates a positive voltage to bias the gate of the transistor M. In another embodiment, to bias the transistor M in an on-state HCI region of operation, the nominal bias $V_{B1}$ is applied to the gate of transistor M. That is, instead of using the biasing circuit 430, the calibration engine 420 closes switch $S_{B1}$ to apply the nominal bias to the gate of the transistor M.

Additionally, to bias the transistor in an on-state HCI region of operation, the drain biasing circuit (not shown) generates a positive voltage (e.g., 2VDD or 2Vmax) to bias the drain of the transistor M. In this embodiment, an additional switch is included to selectively couple the drain biasing circuit to the drain of the transistor M.

In some embodiments, the aging reversal circuit 400 includes multiple biasing circuits (instead of a single biasing circuit 430 as illustrated in FIG. 4A), each connected to the gate of the transistor M through a different switch. For example, the aging reversal circuit 400 includes a first biasing circuit to bias transistor M in an on-state HCI region, and a second biasing circuit to bias transistor M in an off-state HCI region. Moreover, the calibration engine 420 generates control signals to control each corresponding switch to connect the gate of the transistor M to either the first biasing circuit or the second biasing circuit depending on the direction the threshold voltage shift of transistor M.

In yet other embodiments, the biasing circuit 430 generates multiple voltages. For example, the biasing circuit 430 generates a first biasing voltage for biasing the transistor M in an on-state HCI region, and generates a second biasing voltage for biasing the transistor M in an off-state HCI region. The biasing circuit 430 may then include multiple outputs, each for outputting one biasing voltage. In this embodiment, each output of the biasing circuit 430 is connected to the gate of the transistor M through a corresponding switch. The calibration engine 420 then generates control signals to control each corresponding switch to connect the gate of the transistor M to either a first output of the biasing circuit 430 or a second output of the biasing circuit 430 depending on the direction the threshold voltage shift of transistor M.

In yet other embodiments, the biasing circuit 430 is configured to generate multiple voltages based on a control signal received from the calibration engine 420. That is, the voltage output by the biasing circuit 430 may be controlled based on a signal received from the calibration engine 420. For instance, the biasing circuit 430 is configured to generate and output a first voltage (e.g., for biasing the transistor M in an on-state HCI region) when a control signal having a first value is received from the calibration engine 420, and is configured to generate and output a second voltage (e.g., for biasing the transistor M in an off-state HCI region) when a control signal having a second value is received from the calibration engine 420.

Figure 4B:
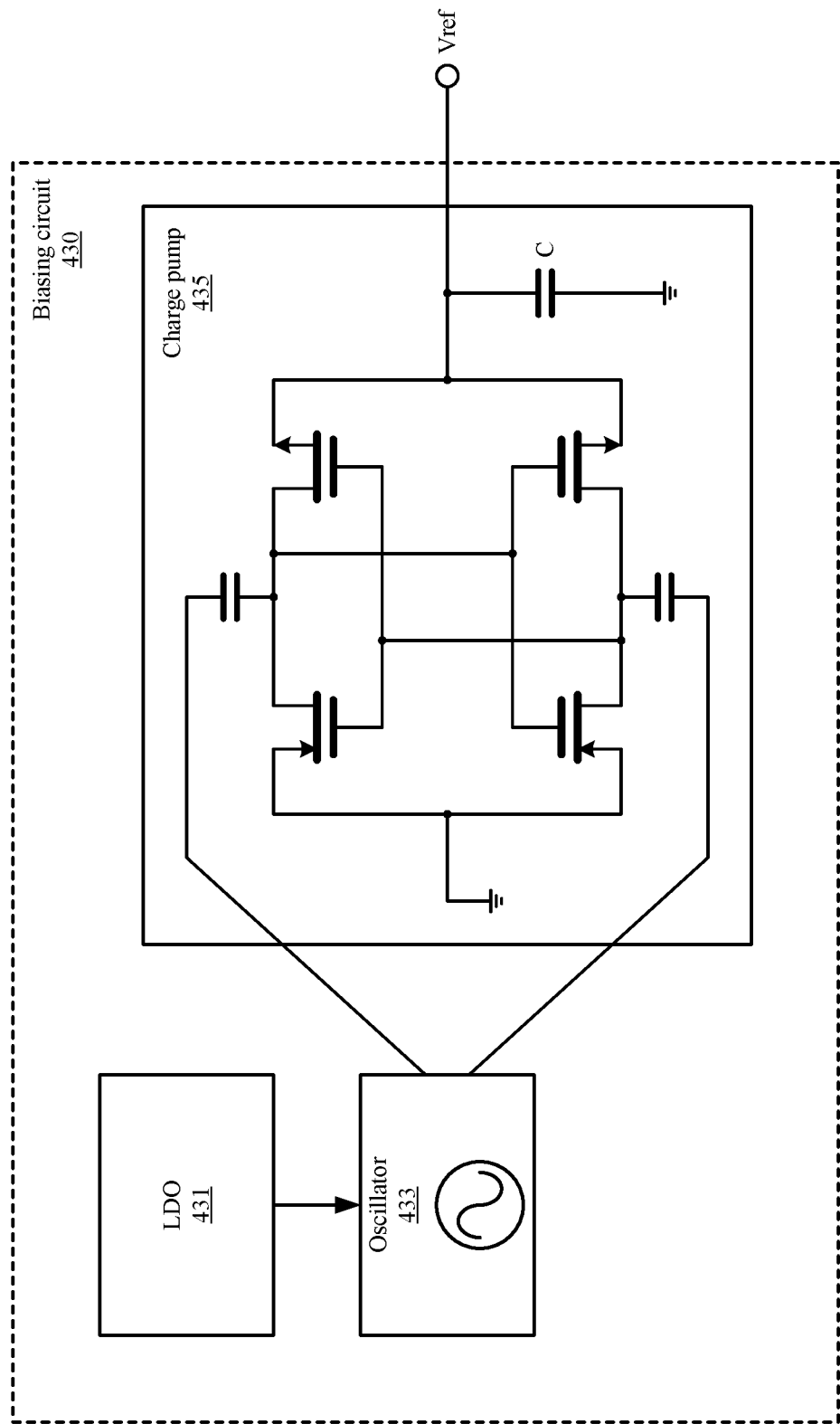
FIG. 4B illustrates an example implementation of a biasing circuit, according to one embodiment.

FIG. 4B illustrates an example implementation of the biasing circuit 430, according to one embodiment. The biasing circuit 430 of FIG. 4B includes a low-dropout (LDO) regulator 431, an oscillator 433, and a charge pump 435. The biasing circuit 430 may generate a gate voltage that increases the likelihood for hot carriers from being injected into the gate oxide of the transistor. For example, the biasing circuit 430 generates a negative voltage (e.g., between −1.2V and −1.8V) to place the transistor M in a region of operation where off-state HCI is experienced.

In some embodiments, the biasing circuit 430 further generates the nominal bias $V_{B1}$ voltage. In this embodiment, the switch $S_{B1}$ is connected to an output of the biasing circuit 430. In other embodiments, the nominal bias $V_{B1}$ is received from an external component.

Referring back to FIG. 4A, the controller 440 controls the operation of the aging reversal circuit 400. For example, the controller 440 controls the calibration engine 420 to enter a calibration mode when the transistor M is inactive. That is, a circuit (such as an amplifier or a transmitter) has an active mode (or normal operation mode) and a calibration mode. During the active mode, the circuit performs a specific function (such as amplifying an input signal or transmitting a signal to a receiver). When the circuit is not in the active mode, the circuit may enter the calibration mode. In the calibration mode, the circuit does not perform the specific function, but instead, one or more components of the circuit are tested. If the one or more components of circuit do not perform within a predetermined range, the one or more components of the circuit are adjusted. For example, in the circuit of FIG. 4A, during the calibration mode, transistor M is tested and adjusted if needed.

During the active mode, the calibration engine 420 closes switch $S_{B1}$ to connect transistor M to a nominal gate bias voltage. Moreover, during the active mode, the calibration engine 420 closes switch $S_D$ to bypass the current mirror 410. In some embodiments, during the active mode, the controller 440 turns off the calibration engine 420 and the biasing circuit 430. In other embodiments, during the active mode, the controller 440 places the calibration engine 420 and the biasing circuit 430 in an idle mode. In some embodiment, switch $S_D$ to bypass the current mirror 410, and switch $S_{B1}$ to connect or disconnect the gate of the transistor M from the nominal bias $V_{B1}$ is controlled by the controller 440, instead of being controlled by the calibration engine 420.

During the calibration mode, the current mirror 410, the calibration engine 420, and the biasing circuit 430 perform operations to test and adjust the transistor M.

During the testing phase, the controller 440 opens switch $S_D$ to allow the current mirror 410 to sense a current $I_{DS}$ flowing through the transistor and generate the mirrored current $I_{sense}$. Moreover, the calibration engine 420 controls switches $S_{B1}$ and $S_{B2}$ to provide a testing bias to transistor M. In some embodiments, the testing bias is the nominal bias $V_{B1}$. In this embodiment, the calibration engine 420 closes the first switch $S_{B1}$ to couple the nominal bias $V_{B1}$ to the gate of transistor M. Alternatively, the calibration engine 420 applies a different testing bias to transistor M. In this embodiment, the calibration engine 420 open the first switch $S_{B1}$ to disconnect the gate of transistor M from the nominal bias and closes a second switch to provide the testing bias to the gate of transistor M. For example, the calibration engine 420 closes a switch connected to an output of the biasing circuit 430 to provide the testing bias to transistor M. The second switch may be switch $S_{B2}$ if the biasing circuit 430 is capable of generating a configurable output voltage, or another switch (not shown) connected to a second output of the biasing circuit 430.

During the testing phase, the calibration engine 420 determines if the mirrored current $I_{sense}$ is within a predetermined range. If the mirrored current $I_{sense}$ is within the predetermined range, the controller 440 ends the calibration mode. Conversely, if the mirrored current $I_{sense}$ is not within the predetermined range, the calibration mode proceeds to the adjustment phase.

During the adjustment phase of the calibration mode, the calibration engine 420 closes switch $S_D$ to bypass the current mirror 410 and instructs the biasing circuit 430 to generates a voltage $V_{B2}$ to bias the transistor M in a region of operation where HCI is experienced. In some embodiments, the calibration mode stays in the adjustment phase for a predetermined amount of time. That is, the voltage $V_{B2}$ to bias the transistor in a region of operation where HCI is experienced is applied to the gate of the transistor M for a predetermined amount of time. After adjustment phase ends, the calibration engine 420 may return back from adjustment phase to the testing phase to determine if additional adjustment should be performed on the transistor M.

Figure 5:
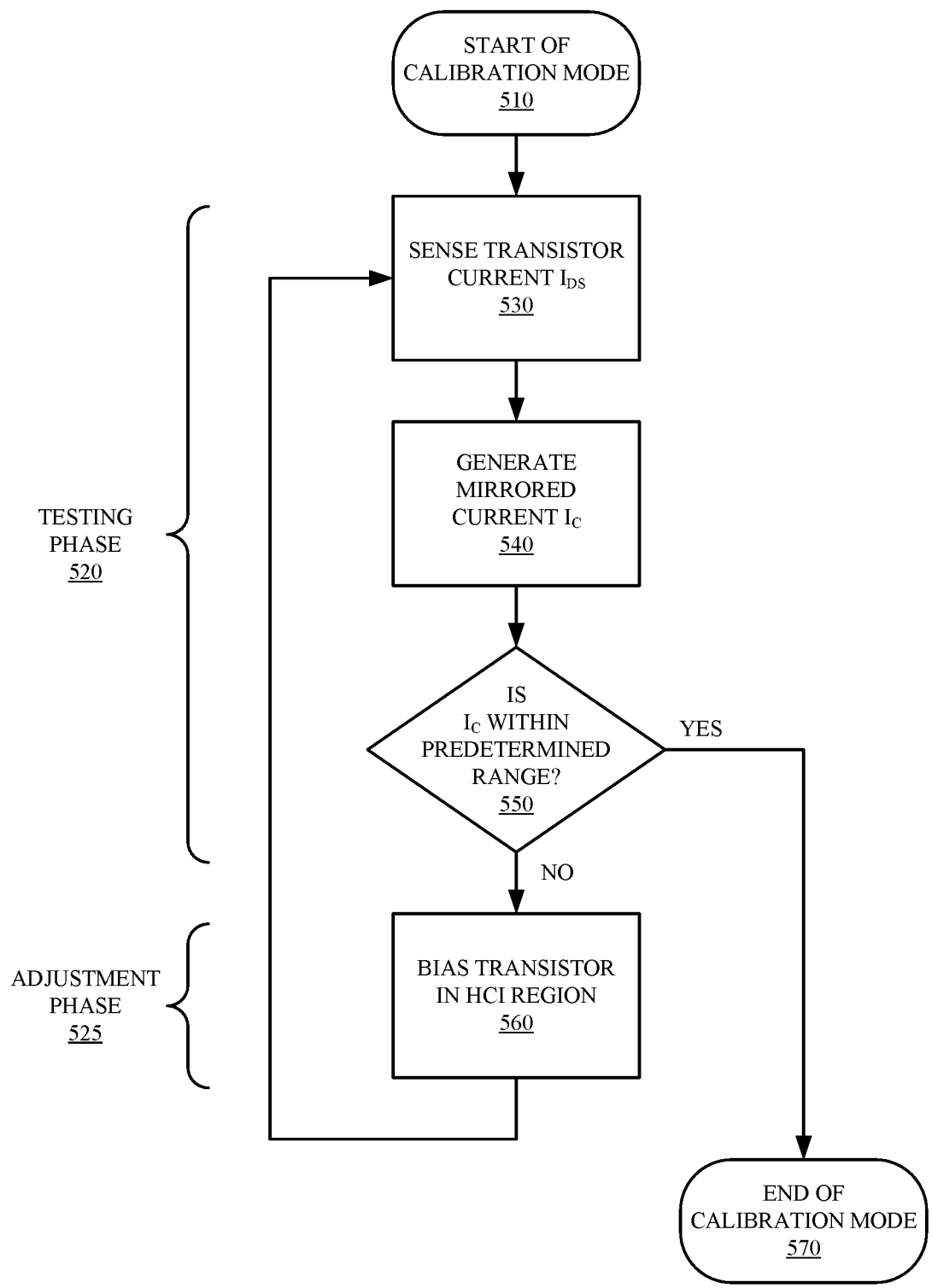
FIG. 5 illustrates a flowchart of a process for calibrating a transistor of a circuit, according to one embodiment.

FIG. 5 illustrates a flowchart of a process for calibrating a transistor M of a circuit, according to one embodiment. In some embodiments, the calibration engine 420 receives (e.g., from the controller 440) a signal indicating that a circuit is not in an active mode. In response to receiving the signal indicating that the circuit is not in an active mode, the calibration engine 420 may enter 510 the calibration mode.

The calibration mode is divided into a testing phase 520 and an adjustment phase 525. During the testing phase 520, the calibration engine 420 activates the current mirror 510. As such, the current mirror 510 senses 530 the transistor current $I_{DS}$ and generates 540 the mirrored current $I_{sense}$ based on the sensed transistor current $I_{DS}$.

The calibration engine 420 determines 550 if the mirrored current $I_{sense}$ is within a predetermined range. For example, the calibration engine 420 may compare the mirrored current $I_{sense}$ to a reference current, and determines a difference between the reference current and the mirrored current $I_{sense}$. If the calibration engine 420 determines that the mirrored current $I_{sense}$ is within the predetermined range, the calibration mode ends 570. Conversely, if the calibration engine 420 determines that the mirrored current $I_{sense}$ is not within the predetermined range, the calibration mode transitions to the adjustment phase 525.

During the adjustment phase, the transistor M is controlled to be biased 560 to be in a region of operation where HCI is experienced. For example, the transistor M is controlled to be in an off-state HCI region of operation. Alternatively, the transistor M is controlled to be in an on-state HCI region of operation. In some embodiment, the bias of the transistor M during the adjustment phase is predetermined based on an expected direction of the shift of the transistor's threshold voltage. Alternatively, the bias of the transistor M is controlled based on an analysis of the mirrored current $I_{sense}$. For example, the calibration engine determines a direction of the threshold voltage shift (i.e., whether the threshold voltage of the transistor has increased or decreased), and biased the transistor to experience off-state HCI or on-state HCI depending on the direction of the threshold voltage shift.

In some embodiments, the transistor M is biased to be in a region of operation where HCI is experienced for a predetermined amount of time. Additionally, at the end of the adjustment period, the calibration mode transitions back to the testing phase 520 to determine if additional adjustment should be applied to the transistor M. In other embodiments, the transistor M is biased to be in a region of operation where HCI is experienced for an amount of time determined based on a difference between the mirrored current $I_{sense}$ and a reference current. That is, the larger the deviation of the mirrored current $I_{sense}$ from the reference current, the longer the transistor M is biased in the region of operation where HCI is experienced. As such, the amount of time hot carriers are allowed to be injected into the oxide of the transistor increases the larger the threshold voltage of the transistor has shifted.

In some embodiments during the adjustment phase, the current mirror 410 is deactivated or bypassed by closing switch $S_D$. Moreover, during the adjustment phase, the transistor is coupled to the biasing circuit 430 by closing switch $S_{B2}$ and opening switch $S_{B1}$. In some embodiments, additional biasing circuits are used during the adjustment phase to control the bias of other terminals of the transistor M. For example, an additional biasing circuit is used to control the drain voltage or the source voltage of the transistor M to increase the probability hot carriers are injected into the gate oxide of the transistor.

Figure 6:
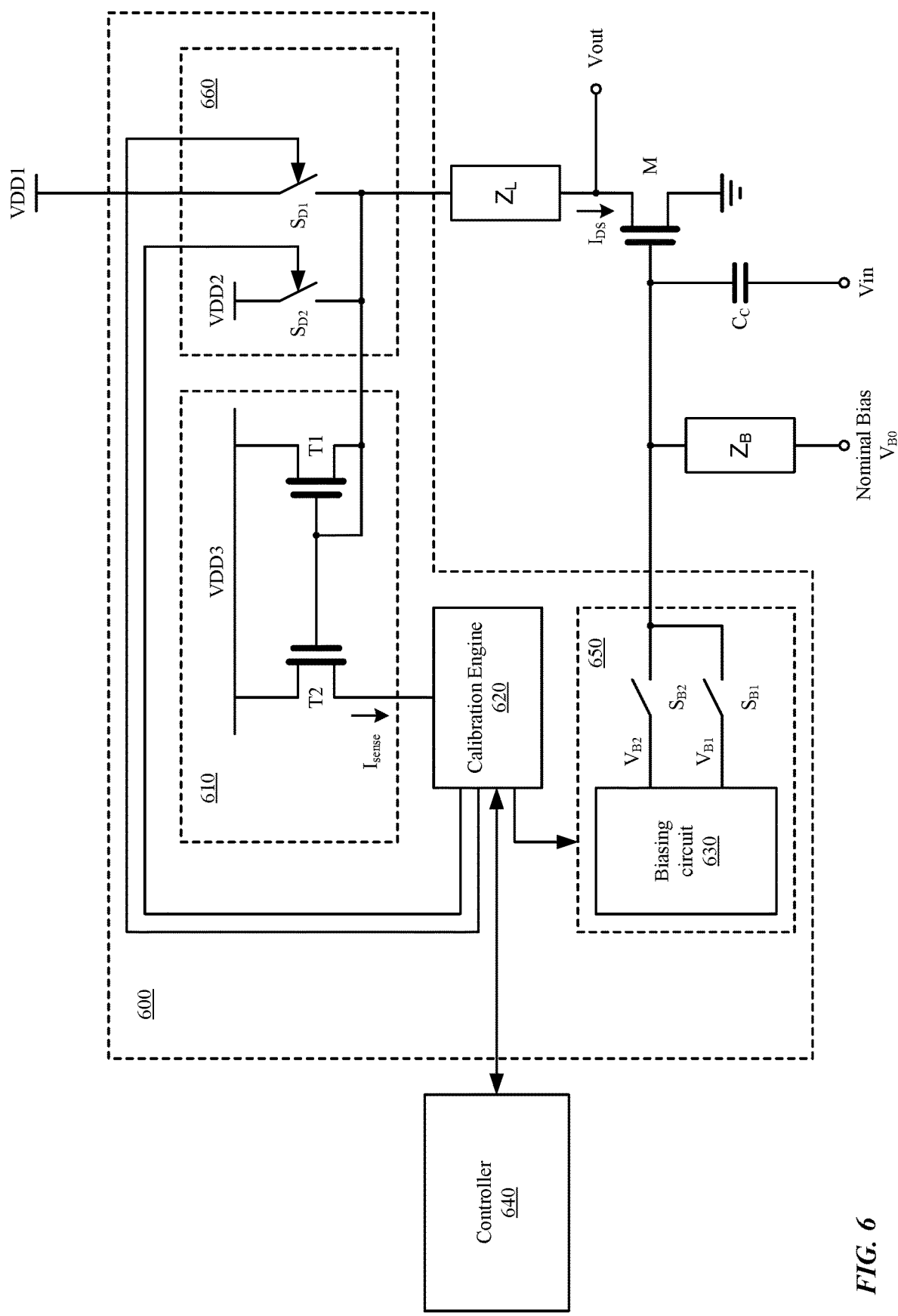
FIG. 6 illustrates a circuit diagram of an aging reversal circuit for restoring a threshold voltage of a transistor by controlling a gate biasing and a drain biasing of the transistor, according to one embodiment.

FIG. 6 illustrates a circuit diagram of an aging reversal circuit 600 for restoring a threshold voltage of a transistor M by controlling a gate biasing and a drain biasing of the transistor M, according to one embodiment. The aging reversal circuit 600 includes a current mirror 610, a calibration engine 620, a gate biasing module 650 having a biasing circuit 630 and switches $S_{B1}$, $S_{B2}$, and a drain biasing module 660 having multiple switches $S_{D1}$, $S_{D2}$. Moreover, although the circuit of FIG. 6 is illustrated using an n-type transistor, other implementations, such as one using a p-type transistor are also possible.

In the aging reversal circuit 600, the gate of the transistor M is connected to a nominal bias $V_{B0}$ through an impedance $Z_B$. Impedance $Z_B$ may be an inductor, a capacitor, a resistor, or any combination thereof. In some embodiments, a switch is connected in between the nominal bias $V_{B0}$ and the gate of the transistor M to allow the nominal bias $V_{B0}$ to be disconnected from the gate of the transistor M. If a switch is included between the nominal bias $V_{B0}$ and the gate of the transistor M, the switch is controlled by the calibration engine 620 such that the switch is opened during an adjustment phase when the transistor M is in a calibration mode.

The gate of the transistor M is further connected to the gate biasing module 650. The gate biasing module 650 includes the biasing circuit 630 having multiple outputs. Moreover, the gate biasing module 650 includes multiple switches, each connected to one output of the biasing circuit 630. For instance, the gate biasing module 650 includes a first switch $S_{B1}$ connected to a first output of the biasing circuit 630, and a second switch $S_{B2}$ connected to a second output of the biasing circuit 630. In some embodiments, the gate biasing module 650 includes additional switches (not shown) connected to additional outputs of the biasing circuit 630.

In some embodiments, the first output of the biasing circuit 630 outputs a first voltage to bias the transistor M in an on-state HCI region of operation, and the second output of the biasing circuit 630 outputs a second voltage to bias the transistor M in an off-state HCI region of operation. To generate each of the outputs, the biasing circuit 630 may include multiple oscillators and multiple charge pumps, each configured to generate a specific voltage.

In some embodiments, the biasing circuit 630 includes additional outputs. For example, the biasing circuit 630 includes an additional output to provide the nominal bias $V_{B0}$. In this embodiment, the nominal bias terminal in FIG. 6 may be connected to the additional output of the biasing circuit 630. In another example, the biasing circuit 630 includes an additional output to provide a biasing voltage $V_{Btest}$ to bias the transistor M during a testing phase when the transistor M is in the calibration mode.

Each of the switches $S_{B1}$ and $S_{B2}$ of the gate biasing module 650 are controlled by the calibration engine 620. That is, the gate biasing module 650 receives a gate bias control signal from the calibration engine 620 and opens or closes the switches $S_{B1}$ and $S_{B2}$ based on the value of the gate bias control signal. In some embodiments, the biasing circuit 630 is also controlled based on the gate bias control signal. For example, the biasing circuit 630 may be configured to be turned on or off, or placed in an idle state based on a value of the gate bias control signal. Moreover, the voltage level of each of the outputs of the biasing circuit 630 may be controlled based on the value of the gate bias control signal.

The drain of the transistor M is coupled to the drain biasing module 660. In some embodiments, the drain of the transistor M is coupled to the drain biasing module 660 through one or more additional components, such as a load impedance $Z_L$. The drain biasing module 660 includes multiple switches $S_{D1}$ and $S_{D2}$. In some embodiments, the drain biasing module may include additional switches.

The first switch Sm of the drain biasing module 660 is connected to a first power supply voltage VDD1. The first power supply voltage VDD1 is a power supply voltage used by the transistor M during normal operation. For example, the first power supply voltage VDD1 may be supplied through a power supply rail of an integrated circuit.

The second switch $S_{D2}$ of the drain biasing module 660 is connected to a second power supply voltage VDD2. The second power supply voltage VDD2 is voltage to bias transistor M in a region of operation where HCI is experienced. That is, the second switch $S_{D2}$ of the drain biasing module 660 is closed during the adjustment phase when the transistor M is in the calibration mode to bias the transistor M in an HCI region of operation. In some embodiments, the drain biasing module 660 includes additional switches to couple the transistor M to additional power supply voltages.

For example, the drain biasing module 660 may include one switch to bias the drain of the transistor M in an off-state HCI region of operation, and one switch to bias the drain of the transistor M in an on-state HCI region of operation. When the second power supply voltage is used to bias transistor M in an on-state HCI region of operation, the second power supply voltage VDD2 is higher than the first power supply voltage VDD1. In some embodiments, the second power supply voltage VDD2 is at least twice the voltage level of the first power supply voltage VDD1. For example, in an embodiment where the first power supply voltage VDD1 is substantially equal to Vmax, the second power supply voltage VDD2 is at least 2Vmax.

In some embodiments, the second power supply voltage VDD2 is received from an external component (e.g., through a second power supply rail). In other embodiments, the second power supply voltage VDD2 is generated internally by the drain biasing module 660. For example, the drain biasing module 660 includes a biasing circuit that includes an oscillator and a charge pump for generating the second power supply voltage VDD2.

In some embodiments, to bias transistor M in an on-state region of operation, the gate biasing module 650 provides a nominal bias to turn transistor M on and the drain biasing module 660 provides a voltage higher than Vmax (e.g., 2Vmax) to increase the electric field to increase the energy of carriers and increase the probability of the carriers from being able to be injected into the gate oxide of transistor M. In some embodiments, the calibration engine 620 uses the nominal bias $V_{B0}$ instead of a voltage output of the biasing circuit 630 to bias transistor M in the on-state HCI region of operation.

In some embodiments, to bias transistor M in an off-state region of operation, the gate biasing module 650 provides a negative bias voltage (e.g., −Vmax) and the drain biasing module 660 closes the first switch SDI to connect the drain of transistor M to the first power supply voltage VDD1. Alternatively, the drain biasing module 660 closes the second switch $S_{D2}$ to connect the drain of transistor M to the second power supply voltage VDD2.

In other embodiments, to bias transistor M in an off-state region of operation, the gate biasing module 650 outputs a zero voltage (0V or GND) and the drain biasing module 660 closes the second switch $S_{D2}$ to connect the drain of transistor M to the second power supply voltage VDD2.

The current mirror 610 includes a main transistor T1 and a mirror transistor T2. The main transistor T1 is coupled to the transistor M and the mirror transistor T2 generates a mirrored current $I_{sense}$ that is proportional to the current $I_{DS}$ flowing through the main transistor T1. The current mirror 610 is connected to a third power supply voltage VDD3. In some embodiments, the third power supply voltage VDD3 is different than the first power supply voltage VDD1 and the second power supply voltage VDD2. In this embodiment, the third power supply voltage VDD3 may be generated internally by the current mirror 610. Alternatively, the third power supply voltage VDD3 may be received from an external component (e.g., through a third power supply rail). In other embodiments, the third power supply voltage is the same as the first power supply voltage VDD1. In this embodiment, the current mirror may be coupled to a power supply rail of the integrated circuit.

Figure 7:
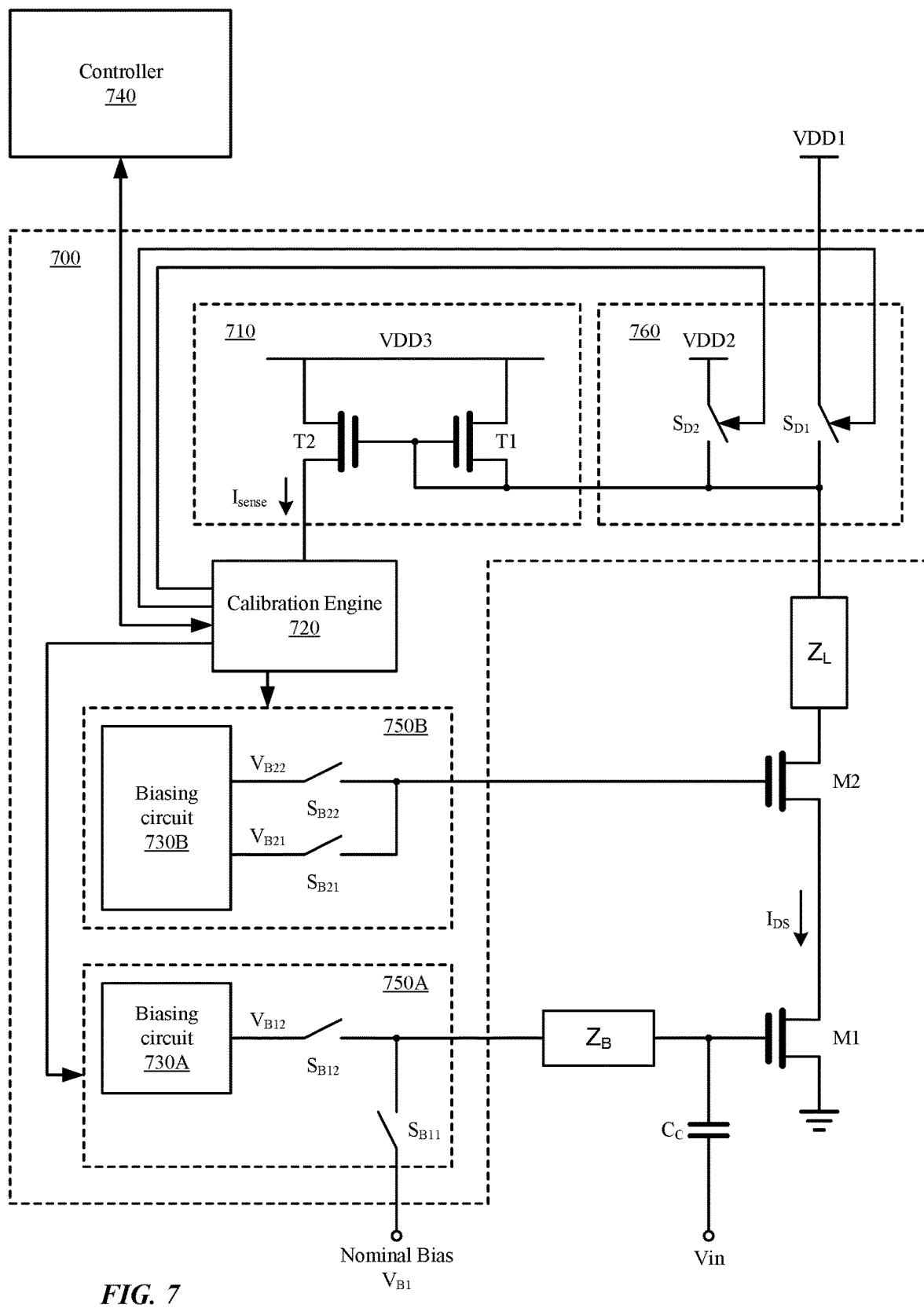
FIG. 7 illustrates a circuit diagram of an aging reversal circuit for restoring a threshold voltage of transistors in a circuit that includes multiple transistors, according to one embodiment.

FIG. 7 illustrates a circuit diagram of an aging reversal circuit 700 for restoring a threshold voltage of transistors in a circuit that includes multiple transistors, according to one embodiment. In particular, the circuit of FIG. 7 includes two transistor M1 and M2. The aging reversal circuit 700 includes a current mirror 710, a calibration engine 720, a first gate biasing module 750A, second gate biasing module 750B, and a drain biasing module 760. Moreover, although the circuit of FIG. 7 is illustrated using n-type transistors, other implementations, such as one using p-type transistors are also possible.

The first gate biasing module 750A is coupled to the gate of the first transistor M1 and is configured to provide a gate biasing for the first transistor M1. The first gate biasing module 750A includes a first biasing circuit 730 and switches $S_{B11}$, $S_{B12}$. In some embodiments, as shown in FIG. 7, the first switch $S_{B11}$ of the first gate biasing module 750A is configured to receive a nominal bias voltage $V_{B1}$. The nominal bias voltage $V_{B1}$ is received from an external component. In other embodiments, the first switch $S_{B11}$ of the first gate biasing module 750A is coupled to an output of the first biasing circuit 730A. The first gate biasing module 750A is controlled by the calibration engine 720.

The second gate biasing module 750B is coupled to the gate of the second transistor M2 and is configured to provide a gate biasing for the second transistor M2. The second gate biasing module 750B includes a second biasing circuit 730B and switches $S_{B21}$, $S_{B22}$. The first switch $S_{B21}$ of the second gate biasing module 750B is coupled to a first output of the second biasing circuit 730B. The second switch $S_{B22}$ of the second gate biasing module 750B is coupled to a second output of the second biasing circuit 730B. In some embodiments, the second biasing circuit 730B includes additional outputs and the second gate biasing module 750B includes additional switches, each connected to one of the additional outputs of the second gate biasing module 750B.

Each biasing circuit 730 (such as the first biasing circuit 730A of the first gate biasing module 750A, or the second biasing circuit 730B of the second gate biasing module 750B) has one or more outputs, each output for providing a different voltage. For example, each biasing circuit 730 may include an output to bias a transistor during normal operation. Moreover, each biasing circuit 730 may include an output to bias a transistor during a testing phase to determine if a threshold voltage of the transistor has shifted. Additionally, each biasing circuit 730 may include an output to bias a transistor in an off-state HCI region of operation. Finally, each biasing circuit 730 may include an output to bias a transistor in an on-state HCI region of operation.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A transistor aging reversal circuit for reverting a shift in a threshold voltage of a transistor, comprising:
   a current mirror configured to sense a transistor current and generate a mirrored current corresponding to the sensed transistor current;
   a gate biasing module comprising:
      a gate biasing circuit configured to generate a bias voltage, the gate biasing circuit configured to operate the transistor in a region where hot carrier injection (HCI) is present, and
      a gate switch coupled to an output of the gate biasing circuit, the gate switch for coupling the gate biasing circuit to a gate terminal of the transistor;

a calibration engine coupled to the current mirror and the gate biasing module, the calibration engine configured to detect a shift in the threshold voltage of the transistor; and a drain biasing circuit coupled to the current mirror, the drain biasing circuit comprising:
  a first drain switch coupled to a first power supply, the first drain switch for coupling a drain terminal of the transistor to the first power supply during normal operation of the transistor, and
  a second drain switch coupled to a second power supply, the second drain switch for coupling the drain terminal of the transistor to the second power supply, the second power supply configured to operate the transistor in the region where HCI is present.

2. The transistor aging reversal circuit of claim 1, wherein the current mirror comprises:
  a first transistor for sensing the transistor current;
  a second transistor having a gate terminal coupled to a gate terminal of the first transistor, the second transistor for generating the mirrored current; and
  a current mirror switch for bypassing the current mirror, the current mirror switch coupled between a source terminal of the first transistor and a drain terminal of the first transistor.

3. The transistor aging reversal circuit of claim 2, wherein the current mirror switch is controlled to be open during a testing phase responsive to determining that the mirrored current is outside of a predetermined range indicative of the shift in the threshold voltage of the transistor, and the current mirror switch is controlled to be closed during an adjustment phase during which the transistor is operated in a mode experiencing HCI.

4. The transistor aging reversal circuit of claim 3, wherein the current mirror switch is further controlled to be closed during normal operation of the transistor.

5. The transistor aging reversal circuit of claim 1, wherein the gate biasing circuit comprises:
  a low-dropout (LOD) regulator for generating a reference voltage;
  an oscillator coupled to the LDO regulator for generating an oscillating signal; and
  a charge pump for generating the bias voltage based on the oscillating signal, the bias voltage for biasing the transistor in a region of operation where hot carriers have a likelihood of being injected into a gate oxide of the transistor.

6. The transistor aging reversal circuit of claim 1, further comprising:
  a second gate switch coupled to the gate terminal of the transistor, the second gate switch for providing a nominal bias to the gate terminal of transistor.

7. The transistor aging reversal circuit of claim 1, wherein the bias voltage configures the transistor to operate in an on-state HCI region, and the calibration engine is further configured to close the gate switch responsive to determining that the mirrored current is larger than a threshold value indicative of a decrease in the threshold voltage of the transistor.

8. The transistor aging reversal circuit of claim 1, wherein the bias voltage configures the transistor to operate in an off-state HCI region, and the calibration engine is further configured to close the gate switch responsive to determining that the mirrored current is lower than a threshold value indicative of an increase in the threshold voltage of the transistor.

9. A method for reverting a shift in a threshold voltage of a transistor, the method comprising:
  sensing a transistor current and generating a mirrored current corresponding to the sensed transistor current;
  generating a bias voltage, the bias voltage for operating the transistor in a region where hot carrier injection (HCI) is present;
  determining whether the mirrored current is outside of a predetermined range indicative of a shift in the threshold voltage of the transistor;
  responsive to determining that the mirrored current is outside of the predetermined range, providing the bias voltage to a gate terminal of the transistor;
  closing a first drain switch during normal operation, the first drain switch for coupling a drain terminal of the transistor to a first power supply; and
  closing a second drain switch in response to determining that the mirrored current is outside of the predetermined range, the second drain switch for coupling the drain terminal of the transistor to a second power supply, the second power supply configured to operate the transistor in the region where HCI is present.

10. The method of claim 9, further comprising:
  opening a current mirror switch during a testing phase responsive to determining that the mirrored current is outside of the predetermined range, the current mirror switch for bypassing a current mirror configured to sense the transistor current and generate the mirrored current.

11. The method of claim 10, further comprising:
  closing the current mirror switch during normal operation, wherein the current mirror switch is further configured to couple the drain terminal of the transistor to a third power supply.

12. The method of claim 9, wherein the bias voltage configures the transistor to operate in an on-state HCI region, and the calibration gate bias voltage is provided to the gate terminal of the transistor responsive to determining that the mirrored current is larger than a threshold value indicative of a decrease in the threshold voltage of the transistor.

13. The method of claim 9, wherein the bias voltage configures the transistor to operate in an off-state HCI region of operation, and the bias voltage is provided to the gate terminal of the transistor responsive to determining that the mirrored current is lower than a threshold value indicative of an increase in the threshold voltage of the transistor.

14. The method of claim 9, further comprising providing the bias voltage to the gate terminal of the transistor for a predetermined amount of time.

15. An electronic circuit, comprising:
  a main transistor having a source terminal coupled to a first power supply, a drain terminal, and a gate terminal; and
  an aging reversal circuit coupled to the gate terminal and the drain terminal of the main transistor, the aging reversal circuit comprising:
    a current mirror coupled to the drain terminal of the main transistor, the current mirror configured to sense a transistor current of the main transistor and generate a mirrored current corresponding to the sensed transistor current,
    a gate biasing module comprising:
      a gate biasing circuit configured to generate a bias voltage, and a gate switch coupled to an output of the gate biasing circuit, the gate switch for coupling the gate biasing circuit to the gate terminal of the main transistor, a calibration engine coupled to the current mirror and the gate biasing module, the calibration engine configured to detect a shift in a threshold voltage of the main transistor, and a drain biasing circuit coupled to the drain terminal of the main transistor, the drain biasing circuit comprising:

a first drain switch coupled to a second power supply, the first drain switch for coupling the drain terminal of the main transistor to the second power supply during normal operation of the main transistor, and a second drain switch coupled to a third power supply, the second drain switch for coupling the drain terminal of the main transistor to the third power supply, wherein the second drain switch is configured to be closed in response to determining that the mirrored current is outside of a predetermined range indicative of the shift in the threshold voltage of the main transistor.

16. The electronic circuit of claim 15, wherein the current mirror comprises:

a first transistor for sensing the transistor current;

a second transistor having a gate terminal coupled to a gate terminal of the first transistor, the second transistor for generating the mirrored current; and a current mirror switch for bypassing the current mirror, the current mirror switch coupled between a source terminal of the first transistor and a drain terminal of the first transistor.

17. The electronic circuit of claim 15, wherein the gate biasing circuit comprises:

a low-dropout (LOD) regulator for generating a reference voltage;

an oscillator coupled to the LDO regulator for generating an oscillating signal; and a charge pump for generating the bias voltage based on the oscillating signal, the bias voltage for biasing the main transistor in a region of operation where hot carriers have a likelihood of being injected into a gate oxide of the transistor.

* * * * *